(12) United States Patent
Shirahama et al.

(10) Patent No.: US 7,288,486 B2
(45) Date of Patent: Oct. 30, 2007

(54) METHOD FOR MANUFACTURING SEMICONDUCTOR DEVICE HAVING VIA HOLES

(75) Inventors: Takeo Shirahama, Tokyo (JP); Toshihiko Shiga, Tokyo (JP); Kouichirou Hori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 2 days.

(21) Appl. No.: 11/472,384

(22) Filed: Jun. 22, 2006

(65) Prior Publication Data

US 2007/0128852 A1 Jun. 7, 2007

(30) Foreign Application Priority Data

Dec. 1, 2005 (JP) ............................. 2005-347487

(51) Int. Cl.
*H01L 21/461* (2006.01)

(52) U.S. Cl. ............... 438/717; 438/718; 257/E21.054; 257/E21.232

(58) Field of Classification Search ................ 438/717, 438/718
See application file for complete search history.

(56) References Cited

U.S. PATENT DOCUMENTS

| 5,571,374 | A | * | 11/1996 | Thero et al. ................. 438/718 |
|---|---|---|---|---|
| 6,239,033 | B1 | | 5/2001 | Kawai |
| 6,362,495 | B1 | * | 3/2002 | Schoen et al. ................. 257/77 |
| 2005/0199882 | A1 | * | 9/2005 | Sankin et al. ................. 257/77 |

FOREIGN PATENT DOCUMENTS

| GB | 2 285 174 | 6/1995 |
|---|---|---|
| JP | 03-163835 | 7/1991 |
| JP | 05-175247 | 7/1993 |
| JP | 07-193214 | 7/1995 |
| JP | 11-045892 | 2/1999 |
| JP | 2002-217197 | 8/2002 |

* cited by examiner

*Primary Examiner*—Trung Dang
(74) *Attorney, Agent, or Firm*—Leydig, Voit & Mayer, Ltd.

(57) ABSTRACT

In a method for manufacturing a semiconductor device wherein via holes are formed in an SiC substrate, a stacked film consisting of a Ti film and an Au film is formed on the back face of the SiC substrate, and a Pd film is formed thereon. Then, an Ni film is formed by non-electrolytic plating, using the Pd film as a catalyst. Thereafter, via holes penetrating through the SiC substrate are formed by etching, using the Ni film as a mask.

10 Claims, 3 Drawing Sheets

METHOD FOR MANUFACTURING SEMICONDUCTOR DEVICE HAVING VIA HOLES

BACKGROUND OF THE INVENTION

1. Field of the Invention

The present invention relates to a method for manufacturing a semiconductor device, and more specifically, to a method for manufacturing a semiconductor device wherein via holes are formed.

2. Background Art

In a device using a compound semiconductor, the heat dissipation properties of the device must be improved to operate transistors at high frequency. Furthermore, the circuit must be securely grounded.

In Japanese Unexamined Patent Publication No. 7-193214, a wiring structure, wherein via holes that penetrate through the substrate are formed to connect the top side of the substrate to the back side thereof, is described.

As a compound semiconductor substrate, an SiC substrate, which excels in heat dissipation properties, is frequently used. When via holes are formed in the SiC substrate, Ni, which has a high etching selection ratio to the SiC substrate, is used as an etching mask.

Here, when the via holes are formed, etching for the thickness of the substrate (about 100 μm) is performed so as to penetrate through the substrate. Therefore, an Ni film having a thickness of about 3 to 4 μm must be previously formed on the SiC substrate. When such a thick Ni film is formed, an electrolytic plating method or a non-electrolytic plating method is used to enhance throughput.

In the above-described plating methods, when a non-electrolytic plating method is used, a Pd film is formed on the SiC substrate, and Ni plating is performed using the Pd film as a catalyst. At this time, if the Pd film is formed directly on the SiC substrate, adhesiveness between the SiC substrate and the Pd film is weakened. Therefore, when an Ni film is formed by plating, the Pd film may peel off due to the stress of the Ni film. Then, a problem that favorable via holes cannot be formed arises.

SUMMARY OF THE INVENTION

The present invention has been developed to solve the above-described problems, and therefore it is an object of the present invention to provide a method for manufacturing semiconductor device to improve adhesiveness between an Ni film used as an etching mask when via holes are formed and the SiC substrate, and to form the via holes favorably, in a method for manufacturing semiconductor device wherein via holes are formed in an SiC substrate.

The above object is achieved by a method for manufacturing a semiconductor device comprising steps of forming a first metal pattern on a surface of an SiC substrate, forming a Pd film on the upper surface of said first metal pattern, forming an Ni film on the upper surface of said Pd film by a non-electrolytic plating method using said Pd film as a catalyst, etching said SiC substrate using said Ni film as a mask to form via holes penetrating through said SiC substrate, and forming metal films on the internal surfaces of said via holes.

According to the present invention, in a method for manufacturing semiconductor device wherein via holes are formed in an SiC substrate, adhesiveness between an Ni film used as an etching mask when the via holes are formed and the SiC substrate can be improved, and the via holes can be favorably formed.

Other features and advantages of the invention will be apparent from the following description taken in connection with the accompanying drawings.

DETAILED DESCRIPTION OF THE PREFERRED EMBODIMENTS

Figure 1:
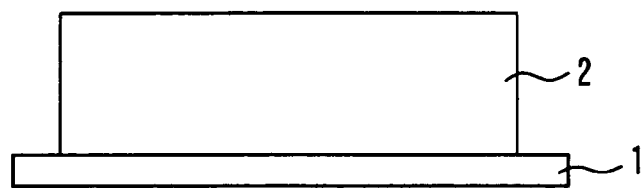
FIGS. 1 through 9 show the cross-sectional structures of a semiconductor device according to the first embodiment.

Embodiments of the present invention will be described below referring to the drawings. In the drawings, the same or equivalent parts will be denoted by the same reference numerals, and the description thereof will be simplified or omitted.

First Embodiment

A method for manufacturing a semiconductor device according to the first embodiment will be described. The semiconductor device is formed using an SiC substrate. The SiC substrate has a top side and a back side, and a GaN-based semiconductor element, such as a high-frequency transistor, is formed on the top side. First, in order to protect elements formed on the substrate, a resist film is applied to the top side of the SiC substrate (element forming side).

Next, wax for semiconductor industries is applied onto the resist film. This wax is composed of a terpene-based resin, vinyl acetate-based resin, and a toluene solvent as major components. Then, as FIG. 1 shows, the top side of the SiC substrate 2 is adhered to the support substrate 1 through the above-described wax. As the material for the support substrate 1, sapphire or hard glass is used.

Figure 2:
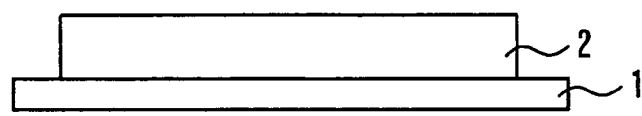

Next, as FIG. 2 shows, the back side of the SiC substrate 2 is polished to make the thickness of the substrate about 100 μm. Thereby, the finally formed semiconductor device can dissipate heat through via holes.

Then, the back side of the SiC substrate 2 is subjected to Ar milling to remove foreign matters and the like adhered on the back side, and to produce moderate roughness (micro-asperity). Thereby, the adhesiveness between a metal film formed on the back side of the SiC substrate 2 in the subsequent step and the SiC substrate 2 can be improved.

Figure 3:
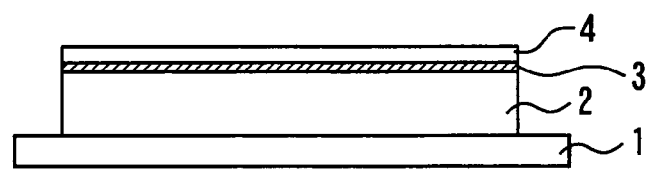

Next, as FIG. 3 shows, a Ti film 3 and an Au film 4 are sequentially formed on the back side of the SiC substrate 2 using a sputtering method. (The Ti film can be substituted by an Ni film.) Furthermore, an image reverse resist is applied onto the Au film 4 to form a resist pattern.

Figure 4:
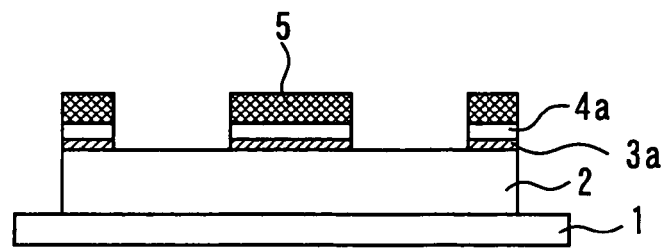
Figure 5:
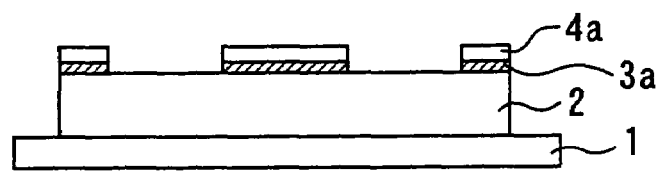

Next, as FIG. 4 shows, the Au film 4 and Ti film 3 are subjected to Ar milling using the resist pattern 5 as a mask to form a stacked pattern (first metal pattern) wherein a Ti film 3a (first Ti film) and an Au film 4a (first Au film) are stacked in the order from the bottom. By forming the stacked pattern, the adhesiveness between an Ni film formed in the subsequent step and the SiC substrate 2 can be improved. Then, the resist pattern 5 is removed. As a result, the structure shown in FIG. 5 can be obtained.

The step for forming the first metal pattern described above can also be performed as follows: After step for forming roughness by Ar-milling the back side of the SiC substrate 2 (cf. FIG. 2), an image reverse resist is applied to form a resist pattern, and thereafter, a Ti film and an Au film are sequentially formed. Furthermore, the image reverse resist is dissolved to form a stacked pattern of the Ti film 3a and the Au film 4a (formed by what is termed as a liftoff method).

Figure 6:
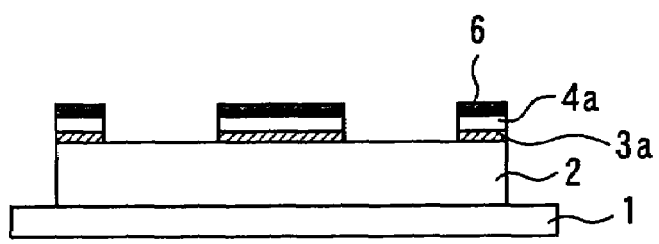

Next, as FIG. 6 shows, a Pd film 6 is formed on the upper surface of the Au film 4a. For example, the Au film 4a is immersed in a Pd activating solution (palladium chloride solution having a metal concentration of about 0.45 to 0.55 g/L) to deposit Pd so that a Pd film 6 is formed on the upper surface of the Au film 4a. Here, by forming the Au film 4a on the SiC substrate 2, Pd can be deposited on the top side of the Au film 4a. Thereby, the Pd film 6 with enhanced adhesiveness to the SiC substrate 2 can be formed on the SiC substrate 2.

The Pd film 6 can be formed using a sputtering method. In this case also, adhesiveness to the SiC substrate 2 can be more enhanced than the case when the Pd film is directly formed on the SiC substrate 2.

Figure 7:
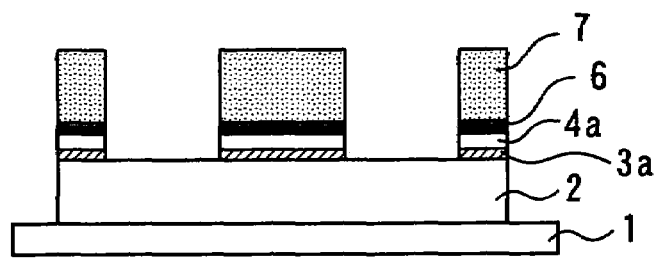

Next, as FIG. 7 shows, an Ni film 7 having a thickness of 4 to 5 µm is formed on the upper surface of the Pd film 6 by a non-electrolytic plating method using the Pd film 6 as a catalyst. Here, the Ni film 7 is a film used as an etching mask when via holes are formed in the subsequent step. As described above, since the Pd film 6 is formed on the upper surface of the Au film 4a, the stress of the Ni film can be relieved, and the peeling of the Pd film can be suppressed compared with the case when the Pd film is directly formed on the SiC substrate 2.

Figure 8:
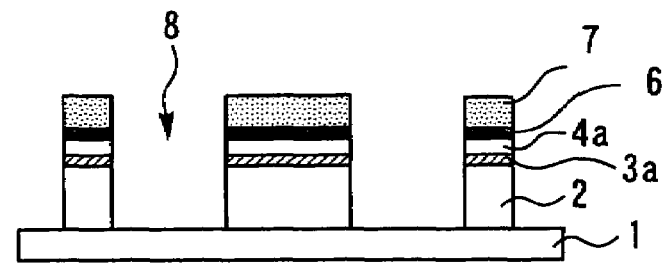

Next, as FIG. 8 shows, the back side of the SiC substrate 2 is etched using the Ni film 7 as a mask to form via holes 8 penetrating through the SiC substrate 2. This etching is performed using, for example, ICP-RIE (Inductively Coupled Plasma-Reactive Ion Etching) equipment. In plasma discharge in the above-described etching, a mixed gas consisting of $SF_6$ and $O_2$ is used.

After the etching, the upper surface of the Ni film 7 has been fluorinated by etching plasma. Therefore, the entire SiC substrate 2 is immersed in an Ni etching solution ($H_2SO_4$:$HNO_3$:$H_2O$=1:1:3) to remove the fluorinated portion (10 nm or less). Thereby, in the subsequent step, a metal film can be favorably formed on the surfaces of the Ni film 7.

Figure 9:
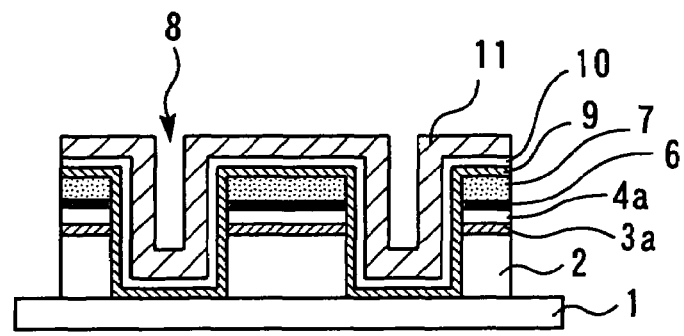

Next, as FIG. 9 shows, a Ti film 9 and an Au film 10 are sequentially formed so as to bury the internal surfaces of the via holes 8 using a sputtering method. (The Ti film can be substituted by an Ni film.) The Ti film 9 is formed so as to coat the upper surface and sides of the Ni film 7. Furthermore, an Au film 11 is formed by an electrolytic plating method using the Au film 10 as a base electrode. As a result, the internal surfaces of the via holes 8 are coated with the Ti film 9 and Au films 10 and 11. Specifically, a stacked film formed by stacking the Ti film 9 (second Ti film), the Au film 10, and the Au film 11 (second Au film) in the order from the bottom, is formed on the internal surfaces of the via holes 8. Since the stacked film is composed of sputtered films, adhesiveness to the SiC substrate 2 is high, and the film peeling from the internal surfaces of the via holes can be effectively prevented.

In the formation of the stacked film, the Ti film 9, the Au film 10, and the Au film 11 are formed without removing Ni film 7. Thereby, the step for removing the Ni film 7 can be omitted, and the number of steps can be reduced.

After the SiC substrate 2 is separated into semiconductor chips from the state of a wafer, when the chips are bonded on a lead frame, the Ni film 7 can be used as alloy forming layers with Au/Sn solder. As described above, the Ti film 9 is formed so as to cover the upper surface and sides of the Ni film 7. Therefore, the Ti film 9 can suppress the excessive incorporation of the Au/Sn solder into the Ni film 7, and can prevent the formation of a void in the Au/Sn solder.

According to the method for manufacturing a semiconductor device of the first embodiment, as described above, the adhesiveness between the SiC substrate and the Ni film used as an etching mask when via holes are formed in the SiC substrate can be improved. Therefore, via holes can be favorably formed in the SiC substrate 2.

Second Embodiment

A method for manufacturing a semiconductor device according to the second embodiment will be described. The second embodiment will be described focusing on aspects different from the first embodiment. First, in the same manner as in the first embodiment, using an SiC substrate, the step for adhering the top side of the SiC substrate 2 on the support substrate (cf. FIG. 1) to the step for removing the resist pattern 5 (cf. FIG. 5) are carried out.

Figure 10:
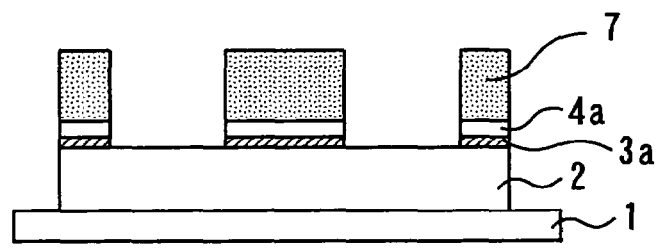
FIGS. 10 and 11 show the cross-sectional structures of a semiconductor device according to the second embodiment.

Next, as FIG. 10 shows, an Ni film 7 having a thickness of about 4 to 5 µm is formed on the upper surface of the Au film 4a by an electrolytic plating method using the Au film 4a as the electrode.

Here, since the Ni film 7 is formed using the Au film 4a as the electrode, it is well adhered to the Au film 4a. Therefore, the adhesiveness between the SiC substrate 2 and the Ni film 7 can be improved. Consequently, when the Ni film is grown, the peeling of the Ni film due to film stress can be prevented.

Figure 11:
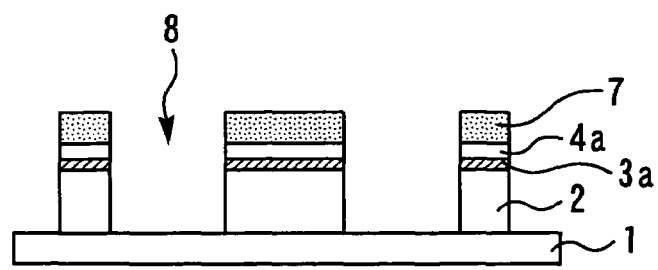

Next, as FIG. 11 shows, the back side of the SiC substrate 2 is etched using the Ni film 7 as a mask to form via holes 8 penetrating through the SiC substrate 2. The etching method is the same as in the first embodiment. At this time, since the Ni film 7 is formed on the upper surface of the Au film 4a, in the same way as in the first embodiment, the adhesiveness between the SiC substrate 2 and the Ni film 7 used as an etching mask when via holes are formed in the SiC substrate 2 can be improved. In addition, the step for forming a Pd film described in the first embodiment can be omitted. Therefore, in addition to the effects obtained in the first embodiment, the number of steps can be reduced.

Thereafter, although not shown in the drawings, a stacked film formed by stacking a Ti film and an Au film in the order from the bottom is formed on the internal surfaces of the via holes are formed in the same manner as in the first embodiment. Other configurations are the same as in the first embodiment.

In the second embodiment, as described above, the Ni film 7 is formed on the upper surface of the Au film 4a using an electrolytic plating method without forming a Pd film on the upper surface of the Au film 4a. Thereby, in addition to the effects obtained in the first embodiment, the number of steps can be reduced.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-347487, filed on Dec. 1, 2005 including specification, claims, drawings and summary, on which the Convention priority of the present application is based, are incorporated herein by reference in its entirety.

The invention claimed is:

1. A method for manufacturing a semiconductor device comprising:
   forming a first metal pattern on a surface of an SiC substrate;
   forming a Pd film on the said first metal pattern;
   forming an Ni film on of said Pd film by non-electrolytic plating, using said Pd film as a catalyst;
   etching said SiC substrate, using said Ni film as a mask, to form via holes penetrating through said SiC substrate; and
   forming metal films on internal surfaces of said via holes.

2. A method for manufacturing a semiconductor device comprising:
   forming a first metal pattern on a surface of an SiC substrate;
   forming an Ni film on said first metal pattern by electrolytic plating, using said first metal pattern as an electrode;
   etching said SiC substrate, using said Ni film as a mask, to form via holes penetrating through said SiC substrate; and
   forming metal films on internal surfaces of said via holes.

3. The method for manufacturing a semiconductor device according to claim 1, further comprising roughening said surface of said SiC substrate before the forming said first metal pattern.

4. The method for manufacturing a semiconductor device according to claim 2, further comprising roughening said surface of said SiC substrate before forming said first metal pattern.

5. The method for manufacturing a semiconductor device according to claim 1, including forming said first metal pattern by stacking a Ti film and a Au film sequentially.

6. The method for manufacturing a semiconductor device according to claim 2, including forming said first metal pattern by stacking a Ti film and a Au film sequentially.

7. The method for manufacturing a semiconductor device according to claim 1, including forming said metal films on the internal surfaces of said via holes by stacking a Ti film and a Au film sequentially.

8. The method for manufacturing a semiconductor device according to claim 2, including forming said metal films on the internal surfaces of said via holes by stacking a Ti film and a Au film sequentially.

9. The method for manufacturing a semiconductor device according to claim 7, including forming said Ti film to cover said Ni film.

10. The method for manufacturing a semiconductor device according to claim 8, including forming said second Ti film to cover said Ni film.

* * * * *